United States Patent [19]

Prasad et al.

[11] Patent Number: 5,268,315
[45] Date of Patent: Dec. 7, 1993

[54] IMPLANT-FREE HETEROJUNCTION BIOPLAR TRANSISTOR INTEGRATED CIRCUIT PROCESS

[75] Inventors: Jayasimha S. Prasad, Tigard; Song W. Park, Aloha; William A. Vetanen; Irene G. Beers, both of Sherwood; Curtis M. Haynes, Portland, all of Oreg.

[73] Assignee: Tektronix, Inc., Wilsonville, Oreg.

[21] Appl. No.: 940,588

[22] Filed: Sep. 4, 1992

[51] Int. Cl.⁵ .......................................... H01L 21/265
[52] U.S. Cl. ........................................ 437/31; 437/59; 437/60; 437/133; 148/DIG. 9
[58] Field of Search .................. 437/31, 59, 133, 126, 437/176, 60; 257/476, 477, 533, 623, 626, 191; 148/DIG. 9, DIG. 72

[56] References Cited

U.S. PATENT DOCUMENTS

| | | | |
|---|---|---|---|
| 4,691,215 | 9/1987 | Luryi | 357/22 |
| 4,771,013 | 9/1988 | Curran | 437/31 |
| 4,981,807 | 1/1991 | Jambotkar | 437/31 |
| 5,051,372 | 9/1991 | Sasaki | 437/5 |
| 5,166,083 | 11/1992 | Bayraktaroglu | 437/31 |

OTHER PUBLICATIONS

Howes et al., "Gallium Arsenide Materials, Devices and Circuits", 1985, pp. 123-143.

*Primary Examiner*—Brian E. Hearn
*Assistant Examiner*—Tuan Nguyen
*Attorney, Agent, or Firm*—Alexander C. Johnson, Jr.; Francis I. Gray

[57] ABSTRACT

The disclosed HBT IC process can fabricate npn heterojunction bipolar transistors, Schottky diodes, MIM capacitors, spiral inductors, and NiCr resistors. Two levels of interconnect metal are available. The first level metal is a conventional dielectric-insulated metal conductor. The second level metal includes an airbridge for contacting the HBT emitters, which are on top of three level mesa structures. It is also an advanced low loss, low capacitance, air dielectric conductor useful for long interconnects and inductors. MIM capacitors are formed by sandwiching silicon nitride between the first layer metal and a capacitor top plate made with landed air-bridge metal. Precision thin film resistors are fabricated by depositing NiCr on silicon nitride. The three-level active mesa structure is etched down to the GaAs substrate, for lateral device isolation, with a truncated pyramidal shape which permits good step coverage of dielectric and metallization layers. The wet etching process uses a composition of $H_3PO_4:H_2O_2:H_2O$ in a preferred ratio of about 3:1:25 for the AlGaAs/GaAs system.

10 Claims, 6 Drawing Sheets

HBT  SCHOTTKY  NiCr RESISTOR

HBT  SCHOTTKY  NiCr RESISTOR

HBT  SCHOTTKY  NiCr RESISTOR

HBT  SCHOTTKY  NiCr RESISTOR

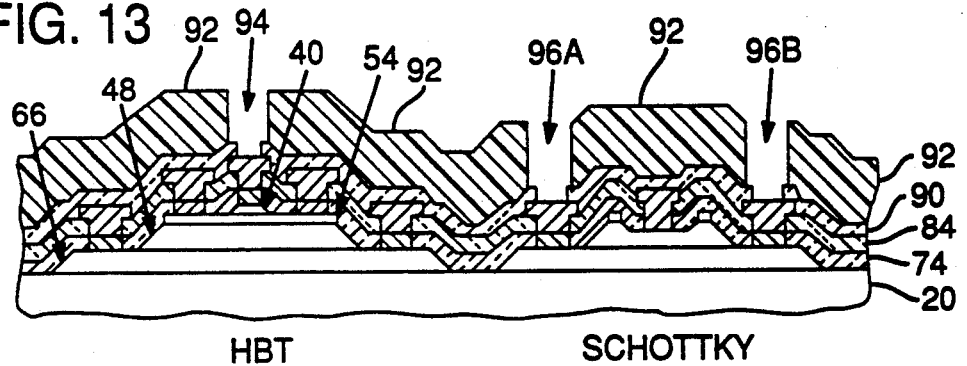
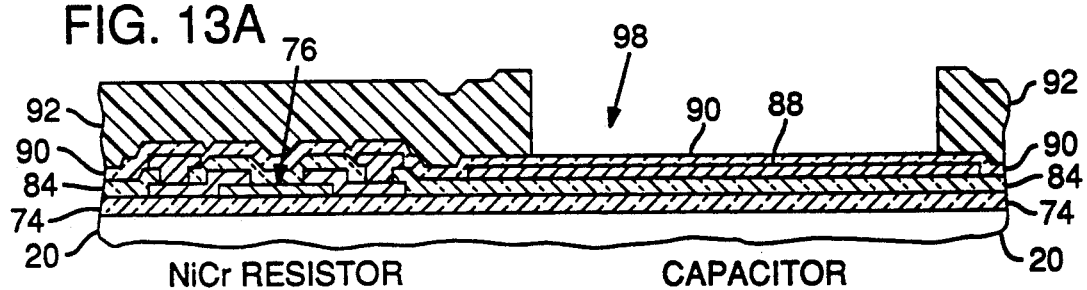
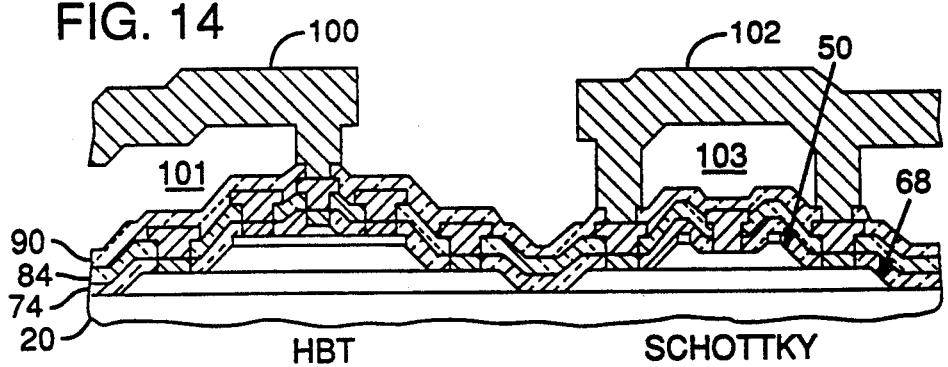
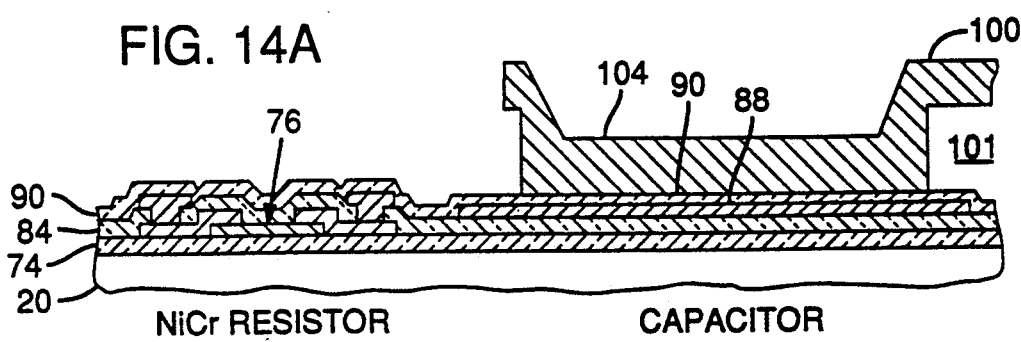

IMPLANT-FREE HETEROJUNCTION BIOPLAR TRANSISTOR INTEGRATED CIRCUIT PROCESS

BACKGROUND OF THE INVENTION

This invention pertains to a method of fabricating heterojunction bipolar transistor (HBT) integrated circuits with Schottky diodes.

In recent years, there has been increasing interest in AlGaAs/GaAs heterojunction bipolar technology. The AlGaAs/GaAs heterojunction bipolar transistor (HBT) is emerging as a preferred device for high speed analog, digital and microwave applications. For example, K. Poulton et al., "A 2Gs/s HBT Sample and Hold", 1988 GaAs IC Symposium, pp. 199-202 (1988), disclose an HBT IC process that produces transistors with an $f_T$ of over 50 GHz. Similarly, M. E. Kim et al., "12–40 GHz Low Harmonic Distortion and Phase Noise Performance of GaAs Heterojunction Bipolar Transistors", 1988 GaAs IC Symposium, pp. 117–120 (1988), disclose an HBT IC process that produces transistors with an $f_{max} \sim$ 30–50 GHz and oscillators operating up to 37.7 GHz. HBT technology has been mostly captive, although a few companies have recently begun to offer HBT foundry services. See P. M. Asbeck et al., "HBT Application Prospects in the U.S.: Where and When?" 1991 GaAs IC Symposium Technical Digest, pp. 7–10 (1991).

An HBT fabrication process differs significantly from the better known MESFET or HEMT IC processes. In the MESFET or HEMT processes, implants and gate recess steps can be used to adjust the threshold voltage of the active device. In contrast, the DC properties of the HBT depend to a great extent on epitaxial growth of layers that form the heterojunction structure. The HBT process must provide isolation, ohmic contacts and other passive elements necessary for circuit realization. Establishing effective process controls for an HBT process requires careful thought and planning. The process must also provide for effective, preferably automated, electrical measurements of, for example, beta, $f_T$, $f_{max}$, base sheet resistance, emitter resistance, etc. The processes described in the above-referenced articles require device isolation implants, which leave behind implant damage, and do not permit effective testing until the devices are essentially complete.

One major difficulty in HBT fabrication arises in connection with etching the heterojunction layers to define the active functional regions of the devices as well as device isolation. Conventional GaAs etching processes and compositions most often use sulfuric acid or hydrochloric acid solutions. These typically produce a retrograde or undercut slope in at least one crystallographic direction on the GaAs substrate, as shown in Gallium Arsenide Processing Techniques by Ralph E. Williams, at pp. 109–123 (1984). Other GaAs etchants are listed on page 120, including $H_3PO_4:H_2O_2:H_2O$ in a 1:1:1 ratio, but their etching characteristics other than etch rate are undisclosed. An example of a device formed with the retrograde or undercut slope are shown in FIG. 2 of the above-referenced Poulton et al article. One problem with this structure is the difficulty in getting good step coverage of subsequently-deposited metal layers. This affects metallization of the device structures. To reduce the step height, to solve the step coverage problem, the prior art uses implants into the doped lower epitaxial layers to convert them from semiconducting to semi-insulating material. To solve the metal step coverage problem typically requires planarization steps, which also introduce undue complexity to the overall process. Isolation of passive devices such as thin film resistors also requires implantation of the lower epitaxial layers, as shown in FIG. 1 of the aforementioned Kim et al article.

Accordingly, a need remains for an improved heterojunction bipolar transistor (HBT) integrated circuit fabrication process.

SUMMARY OF THE INVENTION

It is, therefore, an object of the invention to simplify the fabrication process for heterojunction bipolar transistor devices and integrated circuits.

Another object of the invention is to alleviate the difficulties of providing effective device isolation in a heterojunction bipolar transistor IC process.

A further object of the invention is to improve the testability of heterojunction bipolar transistor devices, and preferably to enable such testing to be performed earlier in the HBT IC fabrication process.

An additional object is to simplify the formation of passive devices and diodes in an HBT IC process.

The invention is a heterojunction bipolar transistor (HBT) integrated circuit fabrication process in which heterojunction layers are first grown on a semi-insulating substrate by molecular beam epitaxy (MBE) or metallo-organic vapor phase epitaxy (MOVPE) and then emitter and collector mesas are first etched in the grown layers using a photoresist mask. The current gain of the HBT layers can be determined at this time. Next, a third, Schottky diode etch is performed which produces a gate recess region. A fourth isolation mesa etch is then performed until the semi-insulating substrate is exposed, thus avoiding the need for an isolation implant. The wafer is then passivated with a nitride layer. A resistive metal alloy layer, such as NiCr, can next be deposited for subsequent formation of resistors, and then n-ohmic metal contacts and p-ohmic metal contacts are subsequently defined. Preferably, Au/Ge/Ni is used for the n-ohmic metal contacts and Au/Mn is used for the p-ohmic metal contacts. Subsequently, another nitride layer is deposited and contact vias are etched. Then, a first level metal layer is evaporatively deposited which contacts the ohmic metal. This metallization step also forms anodes for Schottky diodes and bottom electrodes for capacitors. After depositing the capacitor nitride layer, vias are etched in the nitride layer for contacting an air-bridge or surface metal layer. A plated air-bridge layer can then be defined which forms air-bridge inductors and the top electrodes of the capacitors.

A novel wet etching process is used to form the emitter and collector mesas, as well as Schottky diode structures, with a truncated pyramidal shape defined by flat trapezoidal ramps extending outward in all dimensions, avoiding the retrograde undercut or dished sidewall profiles that characterize most prior art etching processes. The etching process uses a wet etching composition of $H_3PO_4:H_2O_2:H_2O$ in a preferred ratio of 3:1:25, and can be conducted under atmospheric room temperature conditions. This etchant does not attack photoresist and so it is unnecessary to use a silicon nitride or other form of surrogate mask to etch GaAs, AlGaAs or other GaAs alloys. The same etchant can, therefore, be used for all etching steps in this process.

The process as implemented in the AlGaAs/GaAs/-GaAs system yields 50 GHz HBTs and 1.4 THz Schottky diodes. The process can also be used in InP-/InGaAs/InP, AlInAs/InGaAs/InP, AlInAs/InGaAs/GaAs, GaInP/GaAs/GaAs or other material systems used for HBTs. The process is non-self-aligned and does not use ion-implantation either for isolation or reduction of collector capacitance.

The process has several advantages. Since the process is mesa isolated, the leakage current between devices is extremely small. Since there are no implantation steps, the processing time is reduced and additional costs associated with implanter (such as capital and maintenance costs) are eliminated. The process allows early monitoring of current gain after two masking steps. The Schottky gate recess etch reduces series resistance of Schottky diodes and yields tera Hertz Schottky diodes. Since the GaAs substrate is semi-insulating, parasitic interconnect capacitances are referred to ground which is on the back side of the wafer. The resulting greatly reduced interconnect capacitances, reduced transmission line and inductor losses, and moderately-valued strip-line characteristic impedances help extract the full potential of HBTs in actual circuits.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 13 and 13A are cross-sectional views showing a masking and patterning step to define airbridge contacts and second capacitor plate in the structure of FIGS. 12 and 12A.

FIGS. 14 and 14A are cross-sectional views showing deposition of an airbridge with contacts to the HBT and Schottky diode and of the second capacitor plate after stripping the photoresist shown in FIGS. 13 and 13A.

DETAILED DESCRIPTION

Beginning Wafer Structure

Figure 1:
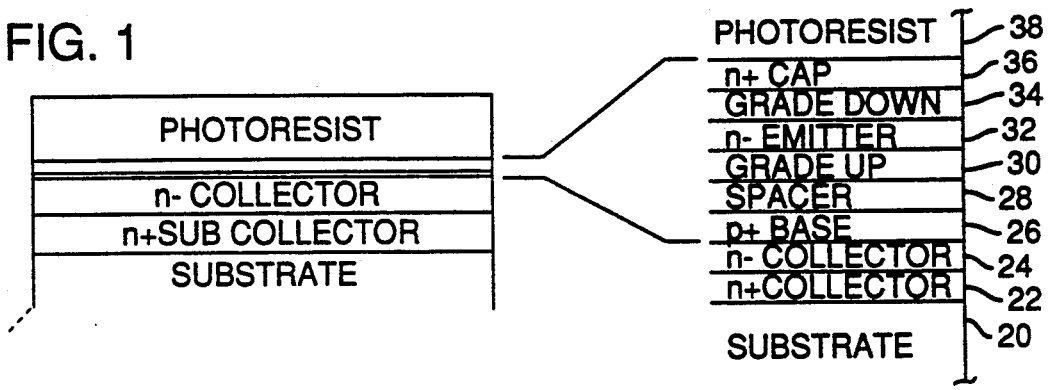
FIG. 1 is a cross-sectional view of a portion of a GaAs wafer with doped epitaxial layers of GaAs and AlGaAs grown thereon to form a preferred beginning heterojunction structure for the process of the present invention.

The wafers used in this process have a typical epitaxial layer structure represented in FIG. 1. The first step in the fabrication process is to epitaxially grow layers 22-36 on semi-insulating substrate 20 as described in Table 1. Layers 22-36 can be grown by either molecular beam epitaxy (MBE) or metallo-organic vapor phase epitaxy (MOVPE).

TABLE 1

| \multicolumn{5}{c}{Epitaxial Structure of HBT Wafer} |
| Ref. No. | Layer | Aluminum fraction | Doping ($cm^{-3}$) | Thickness Angstroms |
| --- | --- | --- | --- | --- |
| 36 | n+ cap | 0 | $n = 5 \times 10^{18}$ | 1000 |
|  |  | 0 | $n = 5 \times 10^{18}$ |  |
| 34 | grade down | linearly 0-25% |  | 300 |
|  |  | 25% | $n = 5 \times 10^{17}$ |  |
| 32 | n− emitter | 25% | $n = 5 \times 10^{17}$ | 1000 |
|  |  | 25% | $n = 5 \times 10^{17}$ |  |
| 30 | grade up | linearly 25%-0 |  | 300 |
|  |  | 0 | $n = 5 \times 10^{17}$ |  |
| 28 | spacer | 0 | intrinsic | 100 |
| 26 | p+ base | 0 | $p = 2 \times 10^{19}$ | 1000 |
| 24 | n− collector | 0 | $n = 3 \times 10^{16}$ | 5000 |
| 22 | n+ subcollector | 0 | $n = 5 \times 10^{18}$ | 5000 |
| 20 | GaAs substrate |  |  | 500 μm |

Wafers grown by these methods are available from commercial sources such as Quantum Epitaxial Design, Inc. of Bethlehem Pa. (MBE) and Epitronix of Phoenix, Ariz. (MOVPE). The dopants can be silicon or selenium for the n-type and beryllium, carbon or magnesium for the p-type. The wafer is then characterized, cleaned, and coated with photoresist layer 38 in preparation for the first masking step.

Mesa Etching and HBT Test Steps

Figure 2:
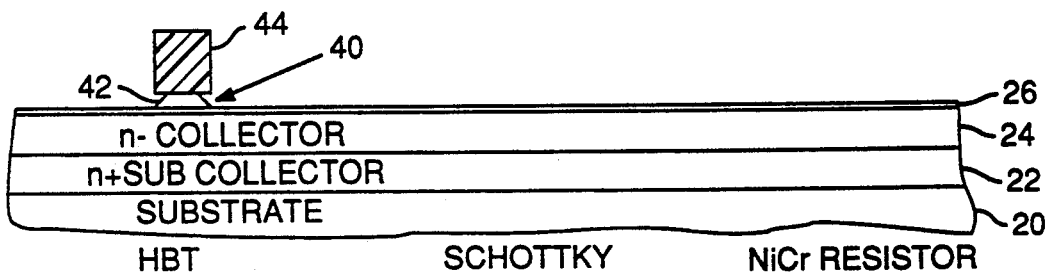
FIG. 2 is a cross-sectional view showing a first masking and patterning step to define a truncated pyramidal emitter of a heterojunction bipolar transistor (HBT) in the structure of FIG. 1.

Referring to FIG. 2, emitter mesas 40 are formed by masking and patterning photoresist layer 38 to form protective pattern 44 to protect the mesas and then etching the remainder of layers 28-36 of the wafer down to the top of the p+ base layer 26. The initial emitter mesa width on the mask is 3.5 μm, but lateral undercutting from the isotropic etch reduces the top of mesa 40 to a width of about 3.0 μm. Its length is similarly reduced.

A novel wet etching process is used in this step to form the emitter mesas 40 and in subsequent steps to form the collector mesas and Schottky diode mesa structures. The etching process uses a wet etching composition of $H_3PO_4:H_2O_2:H_2O$ in a preferred ratio of 3:1:25, and is conducted under atmospheric room temperature conditions. This etchant does not attack photoresist and so it is unnecessary to use a silicon nitride or other form of surrogate mask to etch GaAs, AlGaAs or other GaAs alloys.

Figure 16:
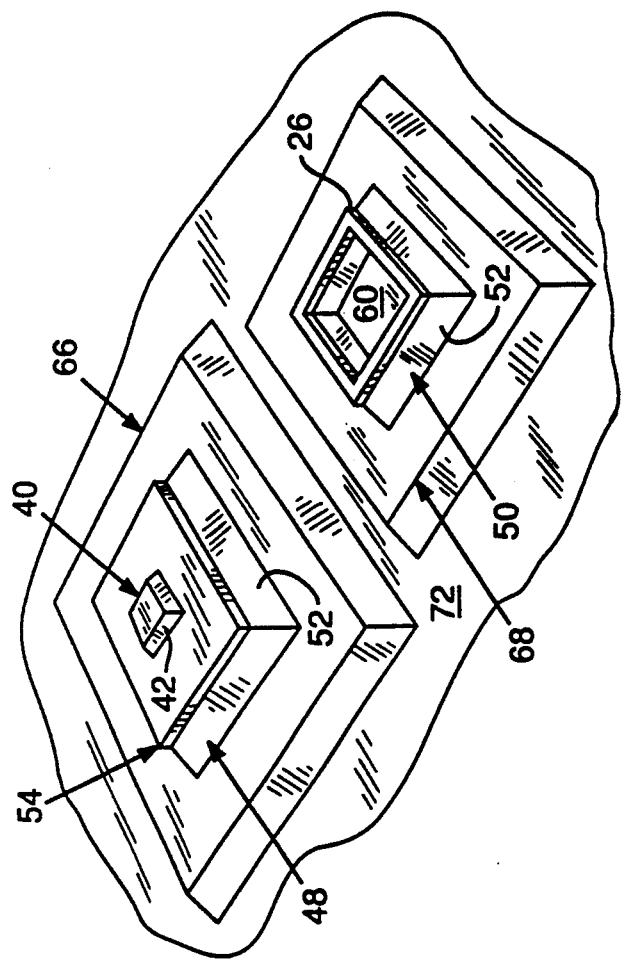
FIG. 16 is a top perspective view showing the completed active device structures of FIG. 14 with the isolation layers and contacts removed.

This etching process is substantially isotropic in that it proceeds laterally at the same etch rate as it proceeds vertically, and does so independently of the crystallographic orientation of the GaAs epitaxial layers. Using an etching composition ratio of about 3:1:25 produces a mesa profile that has a truncated pyramidal shape having mesa sidewalls 42 defined by flat, outward extending ramps in all dimensions, as shown in FIG. 16. The etch thus avoids the retrograde undercut or dished sidewall profiles that characterize most prior art etching processes, and does not require orientation of the device structures perpendicular to the flat side of the wafer. Our experiments show that the $H_3PO_4:H_2O_2:H_2O$ composition in a 1:1:1 ratio produces severe undercuts in all dimensions, like other etchants that have been characterized in the prior art, making it unsuitable for small devices. Higher phosphoric acid to peroxide proportions will also work, as will a more dilute $H_3PO_4:H_2O_2:H_2O$ composition, e.g., a ratio of 6:1:300, but will etch GaAs and AlGaAs more slowly than a higher concentration. It appears that using an aqueous solution of phosphoric acid with hydrogen peroxide in a ratio of 2:1 or more achieves the desired etching isotropy.

Figure 3:
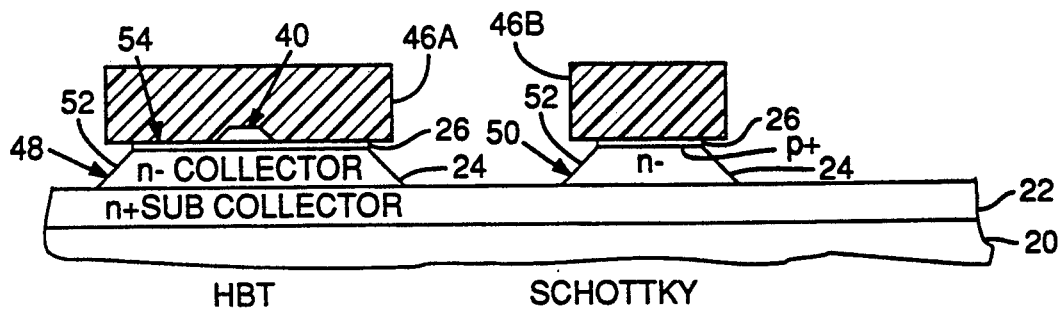
FIG. 3 is a cross-sectional view showing a second masking and patterning step to define a truncated pyramidal base and collector of the HBT and a truncated pyramidal cathode mesa of Schottky diode in the structure of FIG. 2.

Referring to FIG. 3, the next step is a collector etching step. The outer edge of the HBT base 54 and collector 52 and the Schottky cathode 50 are defined by a photoresist patterns 46A, 46B. Then, a mesa etch as described above is used to form the collector 48 and cathode 50 with a truncated pyramidal mesa profile. The etch is nearly isotropic with a slope or ramp on all sidewalls 52 as discussed above, and thereby assures excellent first level metal step coverage. At the conclusion of this step, after stripping photoresist 46A, 46B, the HBT emitter 40, base 54 and collector layers 24, 22 are fully exposed. The transistor is then tested to determine its current gain, and whether processing of the particular wafer should continue. In this way, unsuitable wafers can be rejected at a much earlier stage in the overall process than in the prior art.

Figure 4:
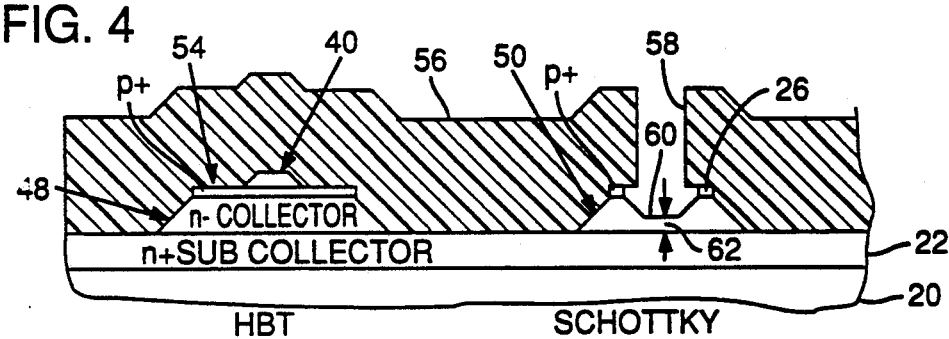
FIG. 4 is a cross-sectional view showing a third masking and patterning step to expose an upper surface of the anode of the Schottky diode in the structure of FIG. 3.

Referring to FIG. 4, a separate photoresist layer 56 is patterned to expose the remaining p+ base layer 26 over the Schottky diode cathode mesa 50 via opening 58. An etching step is now performed to etch through the p+ base layer 26 to stop at a recessed upper surface 60 in the n− collector region spaced a short distance 62, preferably 1500-1800Å, above the n+ subcollector 22. This is the ideal position for a Schottky diode, since the remainder 50 of n− layer 24 provides a good Schottky barrier, and n+ layer 22 provides a low resistance path to the cathode.

Figure 5:
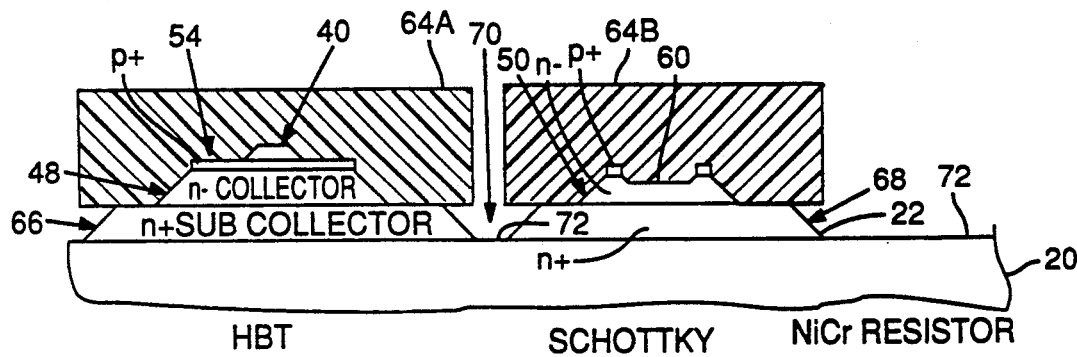
FIG. 5 is a cross-sectional view showing a fourth masking and patterning step with etching down to the semi-insulating substrate to laterally isolate the HBT and Schottky diode in the structure of FIG. 4.

Referring to FIG. 5, another photoresist pattern 64A, 64B is formed and a final mesa etch isolates the various transistors and diodes by removing the remaining exposed areas of n+ layer 22 around and in the region 70 between them. Like the collector mesa etch, this is a deep but non-critical etch, selected to give the resulting n+ subcollector 66 and diode sublayer 68 uniformly sloping sidewalls, as described above. This etch is continued through the n+ subcollector layer 22 to the semi-insulating substrate 20, so that the top surface 72 of the substrate is exposed all around each of the active devices.

In subsequent steps, next described, all the exposed surfaces 40, 48, 50, 54, 60, 66, 68 and 72 are covered by dielectric layers 74, 84, 90, providing effective passivation of the active devices. No implants are needed to isolate the devices, avoiding the cost and process complexities of isolation implants. Moreover, the final device characteristics benefit from substantially improved leakage currents, on the order of $10^{-12}$ Amp. versus typically $10^{-7}$ Amp. in the prior art.

Passivation and Contact Metallization Steps

Figure 6:
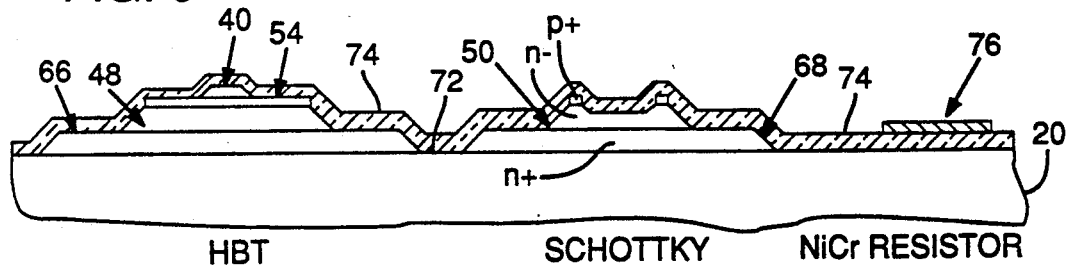
FIG. 6 is a cross-sectional view showing deposition of a first dielectric isolation layer and patterning of a resistor layer on the structure of FIG. 5.

After all three mesa etches have been completed, a layer 74 of silicon nitride is deposited uniformly over the mesa structures, as shown in FIG. 6, to a suitable thickness, e.g., about 2000Å. Then, NiCr resistors 76 are deposited onto this silicon nitride and patterned by a conventional lift-off process. The NiCr metal thickness is adjusted to give 50 ohm/sq. in the final device.

Figure 7:
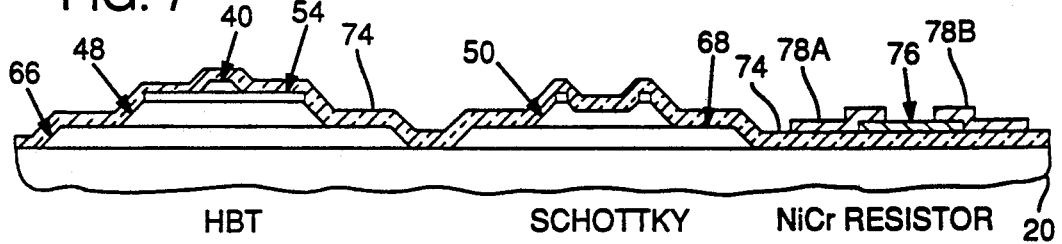
FIG. 7 is a cross-sectional view showing deposition and patterning of contacts across the resistor layer of FIG. 6.

Referring to FIG. 7, resistor contacts 78A, 78B are next formed across the resistor 76. In order to make high quality, stable electrical contacts to the NiCr resistor metal, a low resistivity contact metal such as TiPdAu is placed at the ends of the NiCr by deposition and lift-off. The combination of resistor metal and contacts is then alloyed together and stabilized by a moderate heat treatment.

Figure 8:
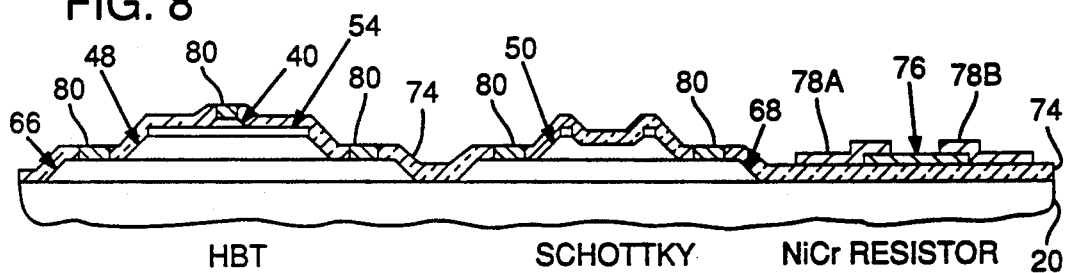
FIG. 8 is a cross-sectional view showing formation of n-ohmic contacts to the emitter and subcollector of the HBT and to the cathode of the Schottky diode in the structure of FIG. 7.

Referring to FIG. 8, openings for n-ohmic contacts 80 on the emitter 40 and collector are then patterned in photoresist on top of the silicon nitride layer 74. The pattern is etched through the nitride layer 74; the n-ohmic contact metal is deposited; and the field areas of contact metal are lifted off. A suitable metal for the n-ohmic contacts is AuGeNi.

Figure 9:
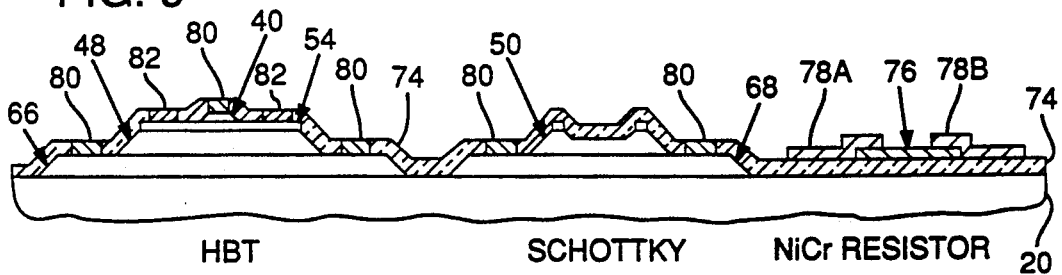
FIG. 9 is a cross-sectional view showing formation of p-ohmic contacts to the base of the HBT in the structure of FIG. 8.

Referring to FIG. 9, a different metallization suitable for p-ohmic contacts, such as AuMn, is similarly deposited through etched via holes in the nitride layer 74 to form p-ohmic contacts 82 to the HBT base 54. The contacts 80, 82 are subsequently alloyed, providing good contact to the semiconductor layers.

Interconnect Isolation and Metallization Steps

Figure 10:
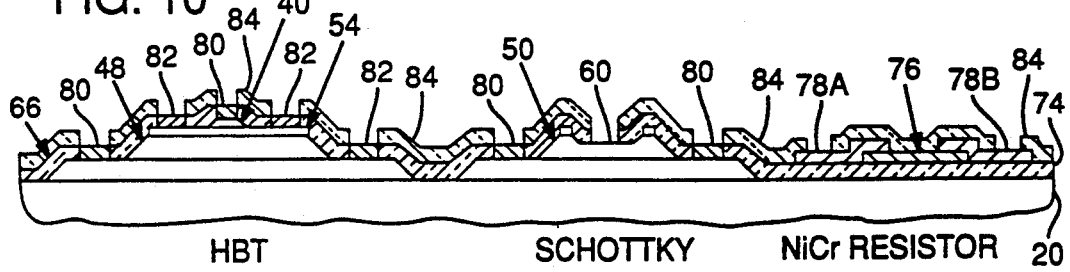
FIG. 10 is a cross-sectional view showing deposition of a second dielectric isolation layer and patterning of such layer to expose the contacts formed in the structure of FIG. 9.
Figure 11:
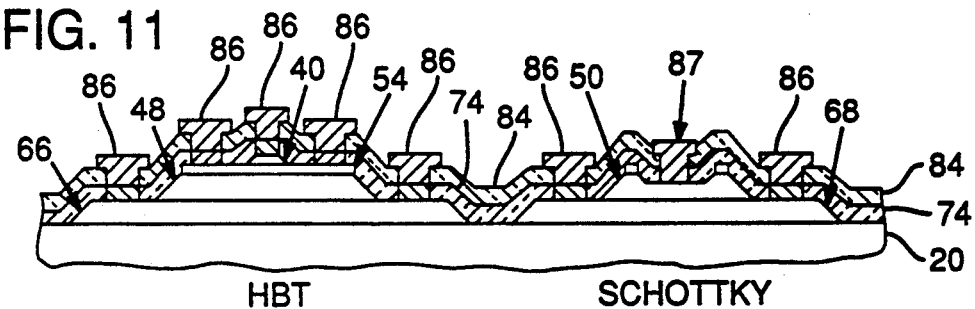
FIGS. 11 and 11A are cross-sectional views of portions of the structure of FIG. 10 showing a first level metallization to form device interconnects and a first capacitor plate.
Figure 11A:
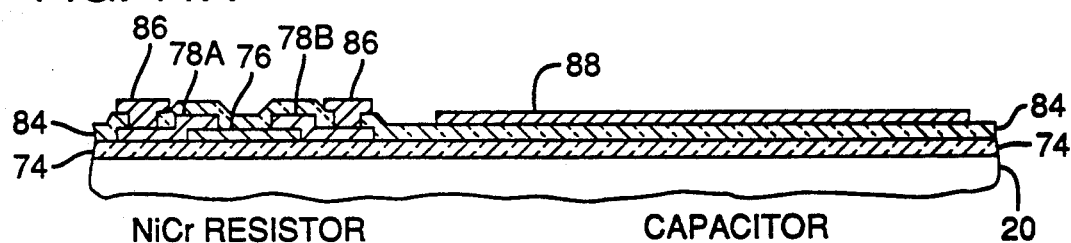

A second layer 84 of silicon nitride is deposited over the entire wafer, as shown in FIG. 10. Via holes are etched through this nitride layer so that first level metal interconnects can contact the emitter, base and collector ohmic metal contacts 80, 82, and Schottky cathode contact 80, and the NiCr resistor contacts 78A, 78B. The first metal also forms the Schottky diode anode 87 on upper surface 60 of mesa 50. To form the first metal interconnects 86, as shown in FIGS. 11 and 11A, a TiPdAu layer is deposited and selectively lifted-off. In addition to being the primary interconnect level, this layer is used to:

1. Form the bottom electrodes 88 of MIM capacitors,
2. Form the anodes 87 of the Schottky diodes, 3. Contact the n-ohmic metal contacts 80 on the transistor emitters 40 and collectors 66,
4. Contact the p-ohmic metal contacts 82 on the transistor bases,
5. Contact the NiCr resistor contact metal 78A, 78B, and
6. Contact the cathodes 80 of the Schottky diodes.

Figure 12:
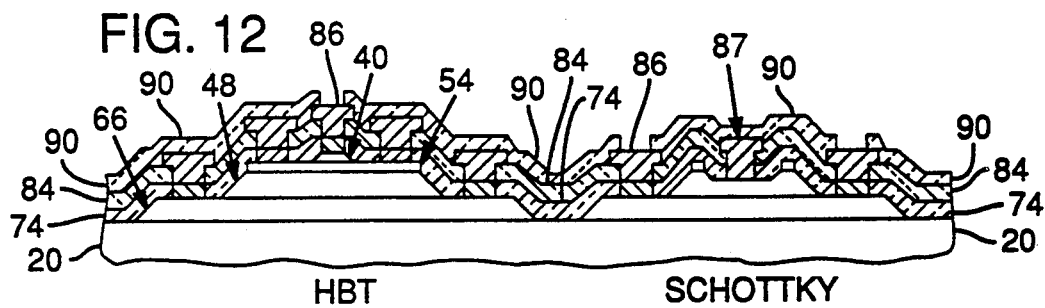
FIGS. 12 and 12A are cross-sectional views showing deposition of a third dielectric isolation layer on the portions of the structure of FIGS. 11 and 11A and patterning of the third isolation layer to expose the HBT emitter and Schottky cathode contacts.
Figure 12A:
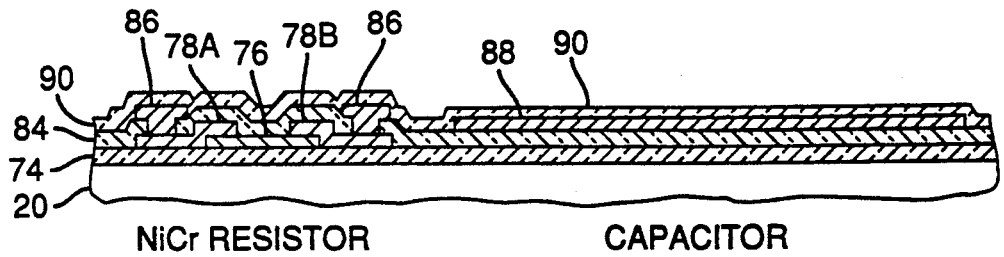

A third and final layer 90 of silicon nitride is deposited, as shown in FIGS. 12 and 12A, as a passivation of the first level metallization and as a dielectric for the MIM capacitors. Vias are defined and etched in this silicon nitride layer above the transistor emitter ohmic contacts 86 so that second level or air-bridge metal interconnects can contact the emitters 40. In addition, via holes are etched wherever else an electrical contact is necessary between the first layer metal and the second layer metal (air-bridge metal), such as to the Schottky diode cathodes. Where an MIM capacitor is desired between the first level metallization and the second level metal layer, there will be no via and hence no etch in the nitride layer 90. This layer of nitride forms the capacitor dielectric.

Next, as shown in FIGS. 13 and 13A, photoresist layer 92, patterned with air-bridge vias 94, 96A, 96B, is used to make contact from air-bridge metal to the first level metal 86. Air-bridge vias 98 are also used in completing MIM capacitors. The air-bridge via 98 defines the area where the air-bridge metal "lands" on top of the dielectric layer 90 over metal layer 88. Air-bridge metal is used to:
1. Contact the first level metal 86,
2. Interconnect various parts of the circuit,
3. Form spiral inductors 100.

The photoresist layer 92 is then stripped, leaving air gaps 101, 103 under the air bridge structures 100, 102 as shown in FIGS. 14 and 14A.

Figure 15:
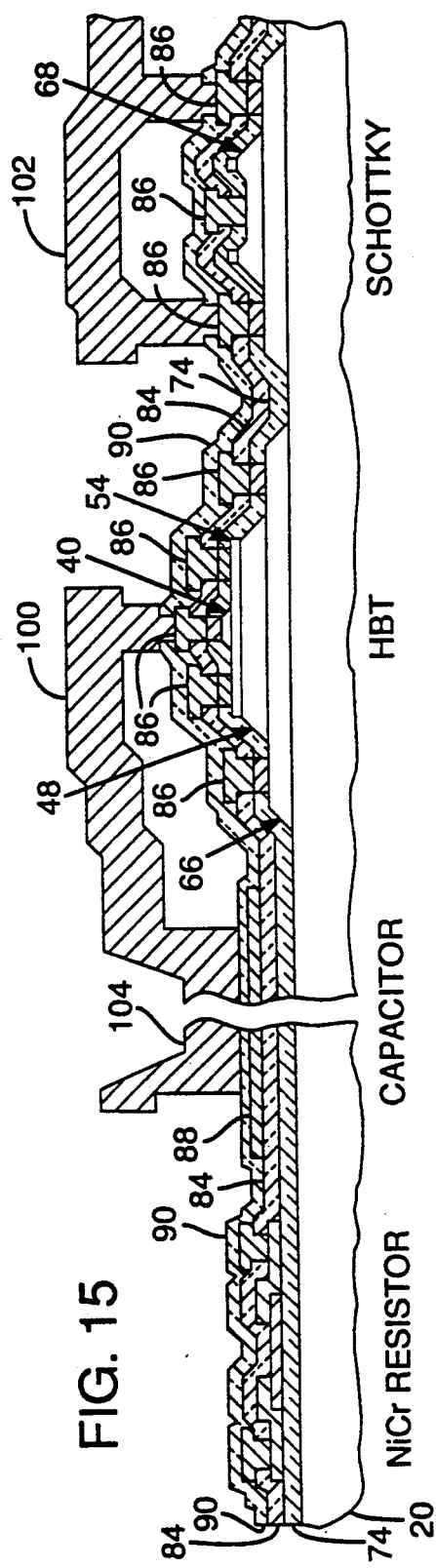
FIG. 15 is a cross-sectional view showing the completed structure of FIGS. 14 and 14A.

The final overall structure, as shown in FIG. 15, can include both active devices—heterojunction bipolar transistors and Schottky diodes—and passives devices—resistors, capacitors and inductors—all in an integrated circuit. Good step coverage is easily achieved because, as shown in FIG. 16, the basic structure of the three levels forming the HBT is a truncated pyramidal shape having a ramped sidewall profile on all sides. Good isolation between devices is achieved without isolation implants because the process enables the three levels forming the HBT to be etched down to the semi-insulating substrate. The gate recess etch of the Schottky diode reduces series resistance so that the diodes yield Tera Hertz performance. This, process also enables early testing of HBT performance.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A heterojunction bipolar transistor (HBT) integrated circuit fabrication process comprising:
   forming at least three heterojunction bipolar transistor (HBT) layers of predetermined thicknesses and conductivities on a semi-insulating substrate, including a first-grown collector layer contacting an upper surface of the semi-insulating substrate, a second-grown base layer atop the collector layer, and a third-grown emitter layer atop the base layer;
   masking, patterning and etching the third-grown layer to form a truncated pyramidal emitter mesa having a predetermined first width at a bottom surface, and thereby exposing the base layer around the emitter mesa;
   masking, patterning and etching the second- and first-grown layers to form a base mesa having a predetermined second width greater than the first width, and to form a truncated pyramidal collector mesa having a predetermined third width at a bottom surface greater than the second width;
   etching through the first-grown layer to expose the upper surface of the semi-insulating substrate all around the collector mesa, the base and emitter mesas being stacked on the collector mesa to form a bipolar transistor;
   depositing a passivating layer over the upper surface of the semi-insulating substrate and the mesas to isolate the bipolar transistor on the substrate; and
   forming emitter, base and collector contacts through the passivating layer to contact respectively the emitter, base and collector mesas.

2. An HBT fabrication process according to claim 1 including determining a current gain of the HBT layers after forming the collector mesa and prior to depositing the passivating layer and forming the emitter, base and collector contacts.

3. An HBT fabrication process according to claim 1, wherein the steps of masking, patterning and etching the second- and first-grown layers, of etching through the first-grown layer, of depositing a passivating layer, and of forming contacts include:
   masking, patterning and etching the second- and first-gown layers at a location spaced laterally from the collector mesa to form a cathode mesa having a predetermined width
   etching through the first-grown layer to form a subcathode mesa having a predetermined width greater than the cathode mesa width and to expose the upper surface of the semi-insulating substrate all around the subcathode mesa, the cathode mesa being stacked on the subcathode mesa to form a Schottky diode;
   depositing the passivating layer over the upper surface of the semi-insulating substrate and the cathode and subcathode mesas to isolate the cathode and subcathode mesas from the bipolar transistor on the substrate; and
   forming anode and cathode contacts through the passivating layer to contact respectively the upper surfaces of the cathode and subcathode mesas.

4. An HBT fabrication process according to claim 3 including:
   forming the collector layer as two sublayers of differing doping concentrations so that the subcathode mesa has a greater doping concentration than the cathode mesa; and
   etching a gate recess in the cathode mesa through the base layer to reduce the thickness of the cathode mesa sublayer prior to forming the anode.

5. An HBT fabrication process according to claim 4 in which the reduced thickness of the cathode mesa is in a range of 1500–1800 Å.

6. An HBT fabrication process according to claim 1 including:
   forming a resistive metal layer on the passivation layer;

forming resistor contacts at locations spaced apart across the resistive metal layer; and forming a second passivation layer over the resistor contacts and resistive metal layer.

7. An HBT fabrication process according to claim 1 including:

depositing and patterning a first level metal layer in contact with selected ones of the emitter, base and collector contacts to form a first interconnection of the transistor to other devices formed on the substrate;

forming a third passivation layer over the patterned first level metal layer; and depositing and patterning a second level metal layer in contact with selected portions of the patterned first level metal layer to form a second interconnection of the transistor to other devices formed on the substrate.

8. An HBT fabrication process according to claim 7 wherein a capacitor is formed in parallel with forming the first and second level metal layers, including:

forming a portion of the first level metal layer as a first capacitor plate on the passivating layer;

depositing a third passivation layer over the first level metal layer; and forming a portion of the second level metal layer as a second capacitor plate on the third passivation layer over the first capacitor plate.

9. An HBT fabrication process according to claim 8 wherein an inductor is formed integrally with the capacitor and transistor, including:

forming an air bridge in the second level metal layer;

connecting a first end of the air bridge to a selected contact of the transistor; and connecting a second end of the air bridge to the second capacitor plate.

10. An HBT fabrication process according to claim 1 in which the etching steps include wet etching the HBT layers with an etching composition comprising $H_3PO_4$:$H_2O_2$:$H_2O$ in a ratio of $H_3PO_4$:$H_2O_2$ that is 2:1 or greater so that the HBT mesas are formed with a truncated pyramidal profile.

* * * * *